United States Patent
Maeda

(10) Patent No.: US 10,511,283 B2
(45) Date of Patent: Dec. 17, 2019

(54) SURFACE ACOUSTIC WAVE FILTER, HIGH FREQUENCY MODULE, AND MULTIPLEXER

(71) Applicant: Murata Manufacturing Co., Ltd., Nagaokakyo-shi, Kyoto-fu (JP)

(72) Inventor: Kenta Maeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/261,690

(22) Filed: Jan. 30, 2019

(65) Prior Publication Data

US 2019/0158060 A1 May 23, 2019

Related U.S. Application Data

(63) Continuation of application No. PCT/JP2017/028269, filed on Aug. 3, 2017.

(30) Foreign Application Priority Data

Aug. 5, 2016 (JP) .................................. 2016-155018

(51) Int. Cl.
*H03H 9/145* (2006.01)
*H03H 9/25* (2006.01)
(Continued)

(52) U.S. Cl.
CPC ......... *H03H 9/14582* (2013.01); *H03F 3/189* (2013.01); *H03H 9/02559* (2013.01);
(Continued)

(58) Field of Classification Search
CPC .. H03H 9/14582; H03H 9/02992; H03H 9/25; H03H 9/02559; H03H 9/02834;
(Continued)

(56) References Cited

U.S. PATENT DOCUMENTS

| 6,621,380 | B2 * | 9/2003 | Takamine | ............ | H03H 9/0042 |
| | | | | | 310/313 D |
| 2002/0000898 | A1 | 1/2002 | Takamine | | |

(Continued)

FOREIGN PATENT DOCUMENTS

| JP | 2002-009587 A | 1/2002 |
| JP | 2002-84163 A | 3/2002 |

(Continued)

OTHER PUBLICATIONS

Official Communication issued in International Patent Application No. PCT/JP2017/028269, dated Oct. 17, 2017.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A surface acoustic wave filter includes resonators, wherein one of the resonator includes four or more regions with different pitches of electrode fingers, the pitch of electrode fingers in each of the four or more regions is constant, the pitch of electrode fingers in first regions, among the four or more regions, disposed at both ends of the resonator in a surface acoustic wave propagation direction is smaller than the pitch of electrode fingers in the regions other than the first regions, and the pitch of electrode fingers in a second region adjacent to the first region and the pitch of electrode fingers in a third region adjacent to the first region are different from each other.

18 Claims, 10 Drawing Sheets

(51) Int. Cl.
  *H03H 9/64* (2006.01)
  *H03H 9/72* (2006.01)
  *H03F 3/189* (2006.01)
  *H03H 9/02* (2006.01)
(52) U.S. Cl.
  CPC .... *H03H 9/02834* (2013.01); *H03H 9/02937* (2013.01); *H03H 9/02992* (2013.01); *H03H 9/25* (2013.01); *H03H 9/64* (2013.01); *H03H 9/72* (2013.01); *H03F 2200/165* (2013.01); *H03F 2200/294* (2013.01); *H03F 2200/451* (2013.01)
(58) Field of Classification Search
  CPC ........ H03H 9/02937; H03H 9/72; H03H 9/64; H03H 9/145; H03F 3/189; H03F 2200/451; H03F 2200/294; H03F 2200/165
  USPC .......................................... 333/133, 193–196
  See application file for complete search history.

(56) References Cited

U.S. PATENT DOCUMENTS

| 2002/0047759 A1 | 4/2002 | Takamine |
| 2008/0238576 A1 | 10/2008 | Takahashi et al. |
| 2011/0156842 A1 | 6/2011 | Takamine |

FOREIGN PATENT DOCUMENTS

| JP | 2008-35092 A | 2/2008 |
| JP | 2008-252678 A | 10/2008 |
| JP | 2008-301223 A | 12/2008 |
| WO | 2010/035372 A1 | 4/2010 |

* cited by examiner

---- SMALL PITCH
—·— MEDIUM PITCH
—— LARGE PITCH

SURFACE ACOUSTIC WAVE FILTER, HIGH FREQUENCY MODULE, AND MULTIPLEXER

CROSS REFERENCE TO RELATED APPLICATIONS

This application claims the benefit of priority to Japanese Patent Application No. 2016-155018 filed on Aug. 5, 2016, now Japanese Patent No. JP 6516070 B2 published on May 22, 2019, and is a Continuation Application of PCT Application No. PCT/JP2017/028269 filed on Aug. 3, 2017. The entire contents of each application are hereby incorporated herein by reference.

BACKGROUND OF THE INVENTION

1. Field of the Invention

The present invention relates to a surface acoustic wave filter, a high frequency module including a surface acoustic wave filter, and a multiplexer.

2. Description of the Related Art

High frequency modules including surface acoustic wave (SAW) filters have been developed as circuit modules of mobile communication devices. With the trend of the communication frequency bands becoming broader in recent years, in order to improve the reception sensitivity of high frequency modules, there has been an increasing demand for reception circuit modules with low loss and low noise. For this reason, a high frequency module includes an additional component, such as a low noise amplifier (LNA) at a subsequent stage or a fore stage of a surface acoustic wave filter (see, for example, Japanese Unexamined Patent Application Publication No. 2008-301223).

In general, in the case in which an additional component is connected to a high frequency module, output impedance of a surface acoustic wave filter is adjusted such that an impedance (output impedance) at an output end of the surface acoustic wave filter on the side connected to the additional component is matched with an impedance (input impedance) at an input end of the additional component.

The output impedance of the surface acoustic wave filter is generally adjusted by changing the capacitance of an interdigital transducer (IDT) electrode in a resonator of the surface acoustic wave filter by a method of changing an intersecting width, a pitch of electrode fingers, the number of pairs of electrode fingers, or the like of the IDT electrode.

However, in the case in which the output impedance of the surface acoustic wave filter is adjusted by changing the intersecting width, the pitch of electrode fingers, the number of pairs of electrode fingers, or the like of the interdigital transducer (IDT) electrode, there arises a problem that it is hard to broaden the pass band width while maintaining the low loss characteristics.

SUMMARY OF THE INVENTION

Preferred embodiments of the present invention provide surface acoustic wave filters, high frequency modules, and multiplexers that are each capable of adjusting the output impedance of the surface acoustic wave filters while achieving a broader band and a reduction in loss.

A surface acoustic wave filter according to a preferred embodiment of the present invention is a longitudinally coupled surface acoustic wave filter that includes a plurality of resonators continuously disposed in a propagation direction of a surface acoustic wave; each of the plurality of resonators includes a pair of comb-shaped electrodes each including a busbar electrode, and a plurality of electrode fingers each connected to the busbar electrode and disposed parallel or substantially parallel to each other; the pair of comb-shaped electrodes are disposed so that the plurality of electrode fingers in each of the pair of comb-shaped electrodes are alternately positioned in the propagation direction of the surface acoustic wave; of the plurality of resonators, a first resonator connected to an output terminal of the surface acoustic wave filter includes four or more regions with different pitches of the electrode fingers, and in each of the four or more regions, the pitch of the electrode fingers is constant; of the four or more regions, a pair of first regions disposed at both ends of the resonator in the propagation direction of the surface acoustic wave have a smaller pitch of the electrode fingers than the pitch of the electrode fingers in the regions other than the pair of first regions; and the pitch of the electrode fingers in a second region adjacent to one of the pair of first regions is different from the pitch of the electrode fingers in a third region adjacent to the other one of the pair of first regions.

This enables adjustment of the output impedance of the surface acoustic wave filter including resistance, capacitive impedance, and inductive impedance. Therefore, in a Smith chart, the output impedance of the surface acoustic wave filter is able to be shifted in two or more directions. This enables adjustment of the output impedance of the surface acoustic wave filter without reducing the pass band width.

The pitch of the electrode fingers in the third region may be larger than the pitch of the electrode fingers in the second region.

With this configuration, the output impedance of the surface acoustic wave filter is able to be shifted toward not only resistance but also toward inductive impedance.

The pitch of the electrode fingers in the second region may be larger than the pitch of the electrode fingers in the third region.

This enables shifting of the output impedance of the surface acoustic wave filter toward not only resistance but also toward capacitive impedance.

The four or more regions may be five regions.

With this configuration, the output impedance of the surface acoustic wave filter is able to be adjusted more finely than in the case in which four regions have different values of electrode finger pitches from one another.

The pitch of the electrode fingers in a fourth region disposed at the center of the five regions may be smaller than at least either one of the pitch of the electrode fingers in the second region and the pitch of the electrode fingers in the third region.

With this configuration, the output impedance of the surface acoustic wave filter is able to be shifted toward inductive impedance.

The number of pairs of the electrode fingers in each of the regions other than the pair of first regions may be the same.

With this configuration, even in the case in which the number of pairs of the electrode fingers is the same, the output impedance of the surface acoustic wave filter is able to be shifted in two or more directions in a Smith chart.

A high frequency module according to a preferred embodiment of the present invention includes a surface acoustic wave filter including the above-described features, and a low noise amplifier that is connected to the surface acoustic wave filter and amplifies a high frequency signal having passed through the surface acoustic wave filter.

With this configuration, in a Smith chart, by shifting the output impedance of the surface acoustic wave filter in two or more directions, it is possible to adjust the output impedance without reducing the pass band width of the high frequency module.

Further, a multiplexer according to a preferred embodiment of the present invention includes a plurality of surface acoustic wave filters having the features described above, and each of the plurality of surface acoustic wave filters is connected to a common terminal.

With this configuration, in a Smith chart, by shifting the output impedance of the surface acoustic wave filter in two or more directions, it is possible to adjust the output impedance without reducing the pass band width of the multiplexer.

According to preferred embodiments of the present invention, it is possible to provide surface acoustic wave filters, high frequency modules, and multiplexers that are each capable of adjusting output impedance of the surface acoustic wave filter without reducing the pass band width.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
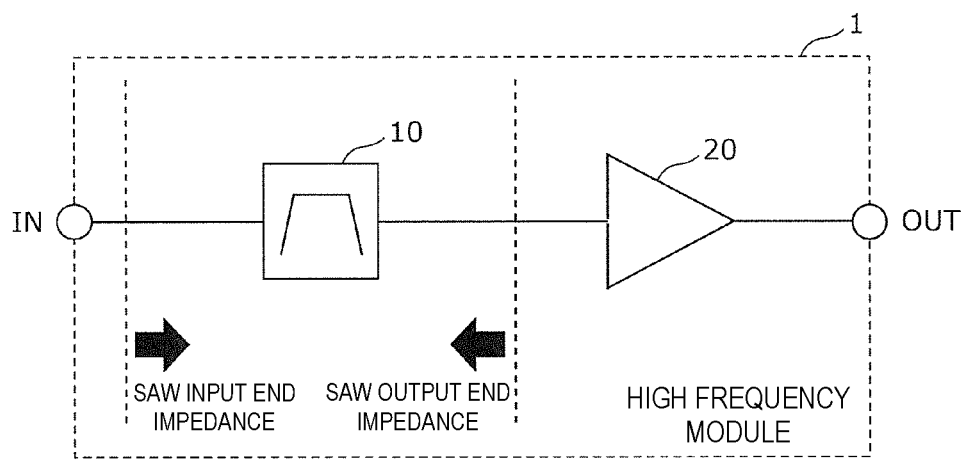
FIG. 1 is a conceptual diagram illustrating a configuration of a high frequency module according to a first preferred embodiment of the present invention.

Hereinafter, preferred embodiments of the present invention will be described with reference to the accompanying drawings. Note that any of the preferred embodiments described below represents a preferred specific preferred embodiment of the present invention. Accordingly, numerical values, shapes, materials, elements, arrangement positions and connection structures of the elements, and other elements and features indicated in the following preferred embodiments are merely examples, and are not intended to limit the scope of the present invention. As such, of the elements in the following preferred embodiments, elements that are not described in the independent claim(s) will be explained as arbitrary elements.

Further, each of the drawings is schematic, and is not necessarily illustrated strictly. In each of the drawings, the same reference signs are assigned to the same or substantially the same elements, and redundant description thereof will be omitted or simplified. Note that the electrode structures in the drawings are illustrated such that, in order to facilitate understanding of preferred embodiments of the present invention, the number of electrode fingers in a resonator and a reflector is smaller than the actual number of electrode fingers. In addition, in the Smith charts in the drawings, an output impedance portion in the pass band of a surface acoustic wave filter is indicated by a thick line.

First Preferred Embodiment

Hereinafter, a first preferred embodiment of the present invention will be described with reference to FIG. 1 to FIG. 11D.

First, a configuration of a high frequency module 1 according to the present preferred embodiment will be described. FIG. 1 is a conceptual diagram illustrating the configuration of the high frequency module 1 according to the present preferred embodiment.

As illustrated in FIG. 1, the high frequency module 1 according to the present preferred embodiment includes a surface acoustic wave filter 10 and a low noise amplifier (LNA) 20. One end of the surface acoustic wave filter 10 is connected to an antenna (not illustrated), and the other end thereof is connected to the low noise amplifier 20. The low noise amplifier 20 is an amplifier to amplify a received weak radio wave without increasing noise as much as possible.

In the surface acoustic wave filter 10, input impedance refers to an impedance of the surface acoustic wave filter 10 when the surface acoustic wave filter 10 is seen from the side of an input terminal IN of the high frequency module 1. In other words, the input impedance is the impedance at the surface acoustic wave (SAW) input side indicated by an arrow in FIG. 1. Meanwhile, output impedance refers to an impedance of the surface acoustic wave filter 10 when the surface acoustic wave filter 10 is seen from a terminal (not illustrated) to which the low noise amplifier 20 as a high frequency signal output destination is connected. In other words, the output impedance is the impedance at the SAW output side indicated by another arrow in FIG. 1.

Figure 2A:
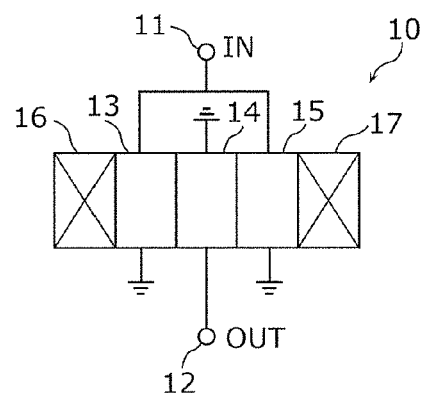
FIG. 2A is a schematic diagram illustrating a configuration of a surface acoustic wave filter according to the first preferred embodiment of the present invention.

The surface acoustic wave filter 10 is preferably a longitudinally coupled surface acoustic wave filter, for example. As illustrated in FIG. 2A, the surface acoustic wave filter 10 includes, between an input terminal 11 and an output terminal 12, a resonator 13, a resonator 14, a resonator 15, a reflector 16, and a reflector 17. The resonator 13, the resonator 14, and the resonator 15 are disposed in that order from the reflector 16 side toward the reflector 17 side.

Figure 2B:
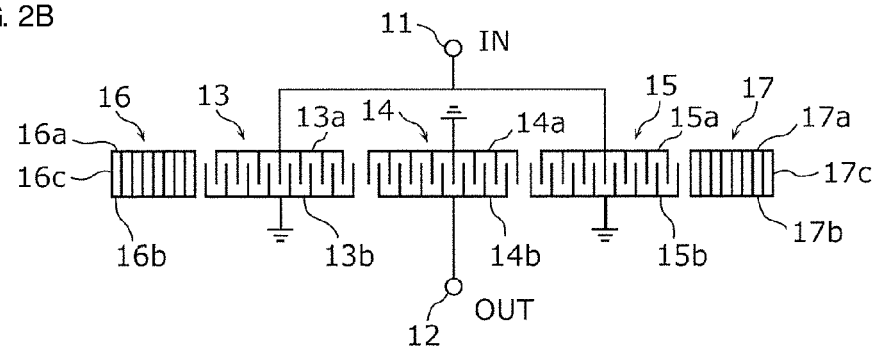
FIG. 2B is a schematic diagram illustrating a specific example of the configuration of the surface acoustic wave filter illustrated in FIG. 2A.

As illustrated in FIG. 2B, the resonator 13 includes two IDT electrodes 13a and 13b that are combined. The IDT electrode 13a of the resonator 13 is connected to the input terminal 11. The IDT electrode 13b is connected to the ground. Similarly, the resonator 15 includes two IDT electrodes 15a and 15b that are combined. The IDT electrode 15a of the resonator 15 is connected to the input terminal 11. The IDT electrode 15b is connected to the ground. The resonator 14 disposed between the resonator 13 and the resonator 15 includes two IDT electrodes 14a and 14b that are combined. The IDT electrode 14a of the resonator 14 is connected to the ground. The IDT electrode 14b is connected to the output terminal 12.

The reflector 16 includes two busbar electrodes 16a and 16b, and multiple electrode fingers 16c, which are provided between the busbar electrode 16a and the busbar electrode 16b and both ends of which are connected to the busbar electrode 16a and the busbar electrode 16b, respectively. Similarly, the reflector 17 includes two busbar electrodes 17a and 17b, and multiple electrode fingers 17c, which are provided between the busbar electrode 17a and the busbar electrode 17b and both ends of which are connected to the busbar electrode 17a and the busbar electrode 17b, respectively.

Figure 3:
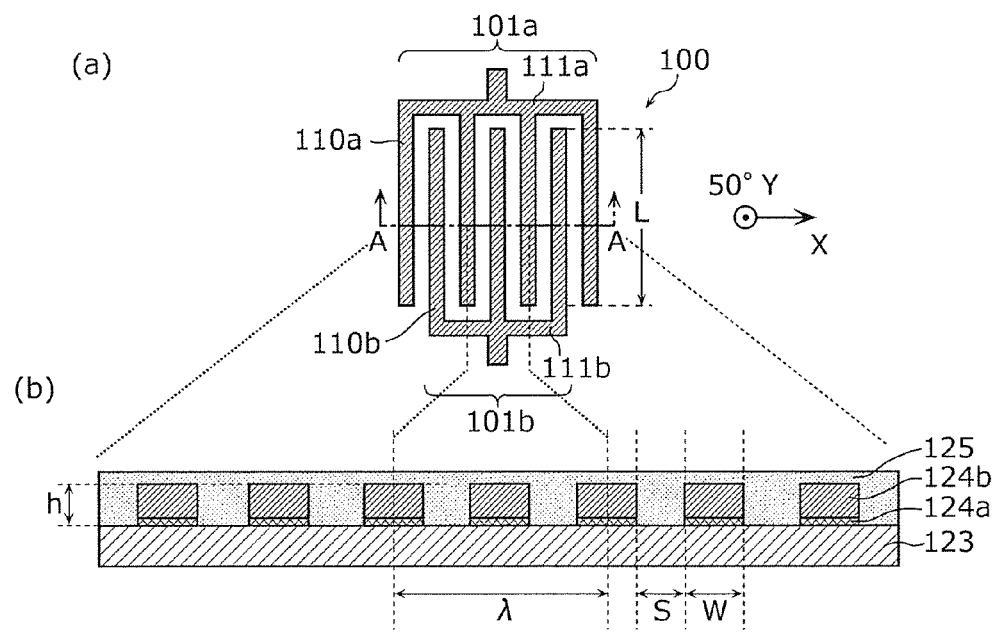
FIG. 3 is a schematic diagram illustrating a configuration of a general surface acoustic wave filter, where portion (a) of FIG. 3 is a plan view, and portion (b) of FIG. 3 is a cross-sectional view taken along a dot-dash line illustrated in FIG. 3(*a*).

Here, the configuration of the resonator will be described in more detail with reference to a general resonator 100. FIG. 3 is a schematic diagram illustrating a configuration of a general surface acoustic wave filter, where portion (a) of FIG. 3 is a plan view, and portion (b) of FIG. 3 is a cross-sectional view taken along a dot-dash line illustrated in portion (a) of FIG. 3.

As illustrated in portions (a) and (b) of FIG. 3, the resonator 100 includes a piezoelectric substrate 123, and an IDT electrode 101a and an IDT electrode 101b, which each have a comb shape (comb-shaped electrodes).

The piezoelectric substrate 123 is preferably made of, for example, a single crystal of $LiNbO_3$ cut at predetermined cut-angles. In the piezoelectric substrate 123, surface acoustic waves propagate in a predetermined direction.

As illustrated in portion (a) of FIG. 3, a pair of IDT electrodes 101a and 101b that oppose each other are provided on the piezoelectric substrate 123. The IDT electrode 101a includes multiple electrode fingers 110a disposed parallel or substantially parallel to each other, and a bus bar electrode 111a connecting the multiple electrode fingers 110a. Further, the IDT electrode 101b includes multiple electrode fingers 110b disposed parallel or substantially parallel to each other, and a bus bar electrode 111b connecting the multiple electrode fingers 110b. The IDT electrode 101a and the IDT electrode 101b are disposed such that the multiple electrode fingers 110a and the multiple electrode fingers 110b of the respective IDT electrodes are alternately arranged in the surface acoustic wave propagation direction. In other words, the IDT electrodes 101a and 101b are structured such that each of the multiple electrode fingers 110b of the IDT electrode 101b is disposed between each of the multiple electrode fingers 110a of the IDT electrode 101a.

Further, as illustrated in portion (b) of FIG. 3, each of the IDT electrodes 101a and 101b includes a close contact layer 124a and a main electrode layer 124b that are laminated.

The close contact layer 124a improves adhesion between the piezoelectric substrate 123 and the main electrode layer 124b, and as a material thereof, for example, NiCr is preferably used.

As a material of the main electrode layer 124b, for example, Pt is preferably used. The main electrode layer 124b may have a single-layer structure including a single layer, or may have a laminated structure including a plurality of layers that are laminated.

A protective layer 125 covers the IDT electrode 101a and the IDT electrode 101b. The protective layer 125 protects the main electrode layer 124b from the external environment, adjusts frequency temperature characteristics, and enhances moisture resistance, for example. The protective layer 125 is preferably, for example, a film including silicon dioxide as a main ingredient. The protective layer 125 may have a single-layer structure or a laminated structure.

Materials used for the close contact layer 124a, the main electrode layer 124b, and the protective layer 125 are not limited to the materials described above. In addition, the IDT electrode 101a and the IDT electrode 101b may not have the laminated structure described above. The IDT electrode 101a and the IDT electrode 101b may be made of, for example, a metal such as Ti, Al, Cu, Pt, Au, Ag or Pd, or an alloy thereof, and may have a laminated structure in which a plurality of layers made of the above metal or alloy are laminated. Note that the protective layer 125 may not be included.

Here, design parameters of the IDT electrode 101a and the IDT electrode 101b will be described. In portion (b) of FIG. 3, λ refers to a pitch of the electrode fingers 110a and 110b of the IDT electrodes 101a and 101b, respectively. In the surface acoustic wave filter, a wave length is defined by the pitch λ of the multiple electrode fingers 110a and 110b of the IDT electrodes 101a and 101b, respectively. To be specific, in the electrode fingers adjacent to each other and connected to the same busbar electrode, the pitch λ refers to a length from the center of a width of one of the electrode fingers to the center of a width of the other one of the electrode fingers. For example, in portion (b) of FIG. 3, λ is a length from the center of a width of one electrode finger 110a connected to the busbar electrode 111a to the center of a width of another electrode finger 110a that is adjacent to the one electrode finger 110a and is connected to the same busbar electrode 111a to which the one electrode finger 110a is connected.

Note that in portion (b) of FIG. 3, W refers to the width of the electrode finger 110a of the IDT electrode 101a and the electrode finger 110b of the IDT electrode 101b in the resonator 100. Further, in portion (b) of FIG. 3, S refers to an interval between the electrode finger 110a and the electrode finger 110b. Note that in portion (a) of FIG. 3, L refers to an intersecting width of the IDT electrode 101a and the IDT electrode 101b, in other words, refers to a length of a portion of the electrode fingers at which the electrode finger 110a of the IDT electrode 101a overlaps with the electrode finger 110b of the IDT electrode 101b. The term "number of pairs" means the number of electrode fingers 110a or the number of electrode fingers 110b.

Note that the structure of the resonator 100 is not limited to the structure illustrated in portions (a) and (b) of FIG. 3. The resonator 13, the resonator 14, and the resonator 15 according to the present preferred embodiment are not limited to the above-described configurations. As described below, the resonator 13, the resonator 14, and the resonator 15 may respectively have configurations in which the pitches of electrode fingers and the numbers of pairs of electrode fingers are different from one another.

Of the three resonators 13, 14, and 15 illustrated in FIGS. 2A and 2B, the resonator 14 connected to the output terminal 12 of the surface acoustic wave filter 10 preferably includes, for example, five regions 141 to 145 in that order from the reflector side toward the reflector 17 side, in which the pitches of electrode fingers are different from one another.

Figure 4:
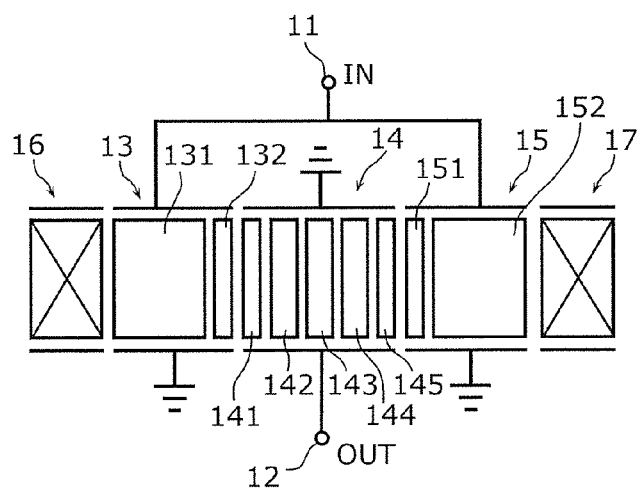
FIG. 4 is a schematic diagram illustrating a configuration of the surface acoustic wave filter according to the first preferred embodiment of the present invention.
Figure 5:
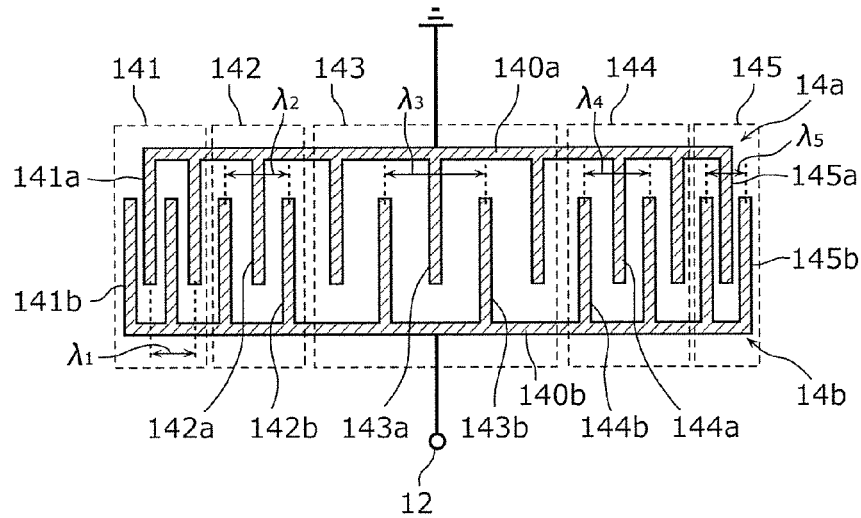
FIG. 5 is a schematic diagram illustrating a configuration of one resonator in the surface acoustic wave filter according to the first preferred embodiment of the present invention.

FIG. 4 is a schematic diagram illustrating the configuration of the resonator 14 such that a region is partitioned into regions each having a different pitch. FIG. 5 is a schematic diagram more specifically illustrating the configuration of the resonator 14.

Specifically, as illustrated in FIG. 5, the resonator 14 includes first regions 141 and 145 disposed at both ends of the resonator 14 in the surface acoustic wave propagation direction, a second region 142 adjacent to the first region 141, a third region 144 adjacent to the first region 145, and a fourth region 143, which is a region between the second region 142 and the third region 144.

Note that, as illustrated in FIG. 5, the resonator 14 includes the IDT electrode 14a and the IDT electrode 14b. The IDT electrode 14a and the IDT electrode 14b each correspond to a comb-shaped electrode in the present preferred embodiment. The IDT electrode 14a and the IDT electrode 14b define a pair of comb-shaped electrodes.

The IDT electrode 14a includes a busbar electrode 140a that is shared in the regions 141 to 145. The IDT electrode 14a includes multiple electrode fingers 141a, 142a, 143a, 144a and 145a, one end of each of which is connected to the busbar electrode 140a, in the regions 141 to 145, respectively.

Similarly, the IDT electrode 14b includes a busbar electrode 140b that is shared in the regions 141 to 145. The IDT electrode 14b includes multiple electrode fingers 141b, 142b, 143b, 144b and 145b, one end of each of which is connected to the busbar electrode 140b, in the regions 141 to 145, respectively. The pitches of electrode fingers are different in the regions 141 to 145.

Note that the first regions 141 and 145 are narrow pitch regions having a smaller pitch than the other regions. The second region, the third region, and the fourth region other than the narrow pitch regions are main pitch regions in which the electrode finger pitches are larger than the electrode finger pitches in the narrow pitch regions.

Here, as illustrated in FIG. 5, the pitch of the electrode fingers in the first region 141 is $\lambda 1$, the pitch of the electrode fingers in the second region 142 is $\lambda 2$, the pitch of the electrode fingers in the fourth region 143 is $\lambda 3$, the pitch of the electrode fingers in the third region 144 is $\lambda 4$, and the pitch of the electrode fingers in the first region 145 is $\lambda 5$. The relationship among the electrode finger pitches of the respective regions is as follows.

The pitches $\lambda 2$, $\lambda 4$, and $\lambda 3$ of the electrode fingers in the second region 142, the third region 144, and the fourth region 143, respectively, are larger than the pitches $\lambda 1$ and $\lambda 5$ of the electrode fingers in the first regions 141 and 145 respectively. The pitch $\lambda 2$ of the electrode fingers in the second region 142 differs from the pitch $\lambda 4$ of the electrode fingers in the third region 144.

For example, the pitch $\lambda 2$ of the electrode fingers in the second region 142 is preferably smaller than the pitch $\lambda 4$ of the electrode fingers in the third region 144. In other words, the electrode fingers 142a and 142b in the second region 142 and the electrode fingers 144a and 144b in the third region 144 satisfy a relationship $\lambda 2 < \lambda 4$. As an example, $\lambda 2$ is about 5.00 μm and $\lambda 4$ is about 5.20 μm. The number of pairs of electrode fingers 142a and 142b in the second region 142 is preferably three, and the number of pairs of electrode fingers 144a and 144b in the third region 144 is preferably five, for example.

As a result, as will be described later in detail, the output impedance of the surface acoustic wave filter 10 changes toward an inductive side.

The relationship between the pitch $\lambda 2$ of the electrode fingers in the second region 142 and the pitch $\lambda 4$ of the electrode fingers in the third region 144 may be such that the pitch $\lambda 4$ of the electrode fingers in the third region 144 is smaller than the pitch $\lambda 2$ of the electrode fingers in the second region 142. In other words, the electrode fingers 142a and 142b in the second region 142 and the electrode fingers 144a and 144b in the third region 144 may satisfy a relationship $\lambda 4 < \lambda 2$. As an example, $\lambda 2$ may be about 5.30 μm and $\lambda 4$ may be about 5.14 μm. The number of pairs of electrode fingers 142a and 142b in the second region 142 may be three, and the number of pairs of electrode fingers 144a and 144b in the third region 144 may be five.

As a result, as will be described in detail later, the output impedance of the surface acoustic wave filter 10 changes toward a capacitive side.

Further, the pitch $\lambda 3$ of the electrode fingers in the fourth region 143 is preferably smaller than, for example, at least one of the pitch $\lambda 2$ of the electrode fingers in the second region 142 and the pitch $\lambda 4$ of the electrode fingers in the third region 144. As an example, $\lambda 3$ is about 5.09 μm. The number of pairs of electrode fingers 143a and 143b in the fourth region 143 is preferably two, for example.

As a result, as will be described in detail later, the output impedance of the surface acoustic wave filter 10 changes toward a capacitive side.

The pitch $\lambda 1$ of the electrode fingers in the first region 141 and the pitch $\lambda 5$ of the electrode fingers in the first region 145 may be equal or substantially equal to or may be different from each other as long as the following relationships are satisfied: $\lambda 1 < \lambda 2$ and $\lambda 1 < \lambda 4$, and $\lambda 5 < \lambda 2$ and $\lambda 5 < \lambda 4$. As an example, $\lambda 1$ is about 4.69 μm and $\lambda 5$ is about 4.77 μm. As an example, the numbers of pairs of electrode fingers in the second region 142, the third region 144, and the fourth region 143 are respectively three, two, and five.

The number of pairs of electrode fingers in each region of the resonator 14 is not limited to the above-described number of pairs, and may be changed.

The resonator 13 adjacent to the resonator 14 includes two regions 131 and 132 in that order from the reflector 16 side toward the reflector 17 side, in which the electrode finger pitches are different from each other. In other words, the region 132 is disposed at the center of the surface acoustic wave filter 10, that is, disposed at a position near the resonator 14. The region 131 is disposed in an outer side portion of the surface acoustic wave filter 10, that is, disposed at a position near the reflector 16.

The pitch of the electrode fingers in the region 132 is preferably smaller than the pitch of the electrode fingers in the region 131. The region 132 is a narrow pitch region. For example, the electrode finger pitch in the region 131 is about 5.15 µm, and the electrode finger pitch in the region 132 is about 4.61 µm. The number of pairs of electrode fingers in the region 131 is 22, and the number of pairs of electrode fingers in the region 132 is three, for example.

The resonator 15 adjacent to the resonator 14 and disposed on the opposite side to the resonator 13 with respect to the resonator 14 includes two regions 151 and 152 in that order from the reflector 16 side toward the reflector 17 side, in which the electrode finger pitches are different from each other. In other words, the region 151 is disposed at the center of the surface acoustic wave filter 10, that is, disposed at a position near the resonator 14. The region 152 is disposed in an outer side portion of the surface acoustic wave filter 10, that is, disposed at a position near the reflector 17.

The pitch of the electrode fingers in the region 151 is preferably smaller than the pitch of the electrode fingers in the region 152. The region 151 is a narrow pitch region. For example, the electrode finger pitch in the region 151 is about 4.87 µm, and the electrode finger pitch in the region 152 is about 5.12 µm. The number of pairs of electrode fingers in the region 151 is five, and the number of pairs of electrode fingers in the region 152 is 20, for example.

The electrode finger pitches in the regions 132 and 151 may be equal or substantially equal to or may be different from the electrode finger pitch in the first region 141 or 145 of the resonator 14. The electrode finger pitches in the regions 131 and 152 may be equal or substantially equal to or may be different from each other. The number of pairs of electrode fingers in each of the regions is not limited to the above-described number of pairs, and may be changed. For example, as will be described later, the number of pairs of electrode fingers in each of the regions may be the same.

Next, output impedance characteristics of the surface acoustic wave filter 10 according to the present preferred embodiment will be described. Hereinafter, description will be provided of output impedance in the cases in which the pitches λ2, λ4, and λ3 of the electrode fingers in the second region 142, the third region 144, and the fourth region 143 of the resonator 14 satisfy the following relationships: λ3<λ2<λ4 (Working Example 1), λ2<λ3<λ4 (Working Example 2), λ3<λ4<λ2 (Working Example 3), and λ4<λ3<λ2 (Working Example 4).

COMPARATIVE EXAMPLE

Figure 6:
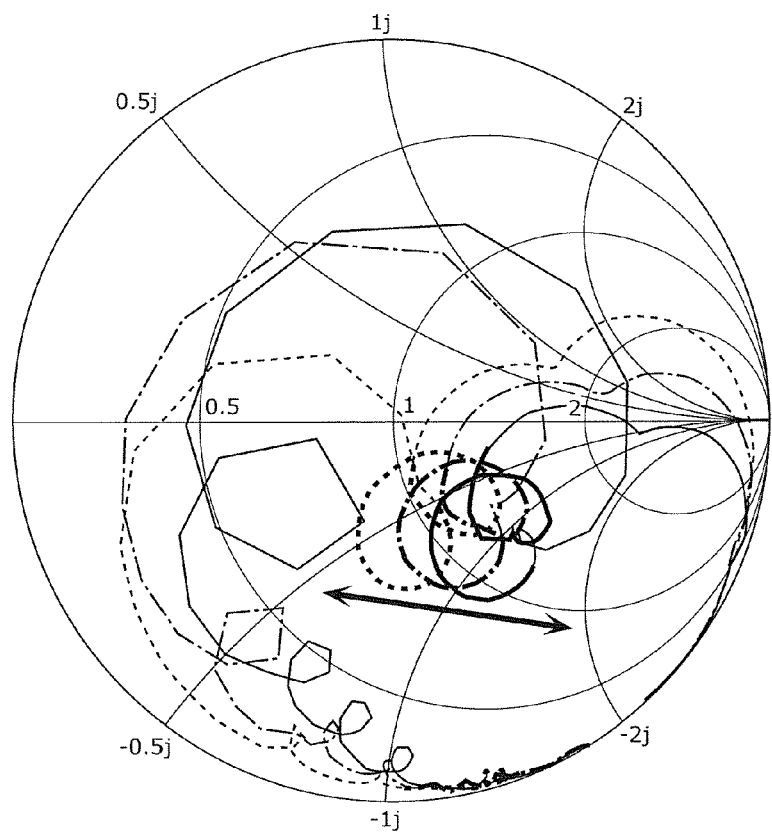
FIG. 6 is a chart showing output impedance characteristics of a surface acoustic wave filter according to a comparative example.

First, in order to facilitate the understanding of the output impedance of the surface acoustic wave filter according to the present preferred embodiment, impedance characteristics of a surface acoustic wave filter 10 according to a comparative example will be described. FIG. 6 is a chart showing output impedance characteristics of the surface acoustic wave filter 10 according to the comparative example.

As the comparative example, the pitches λ2, λ4, and λ3 of the electrode fingers in the second region 142, the third region 144, and the fourth region 143 are made to be equal or substantially equal to each other in length, and the output impedance of the surface acoustic wave filter 10 will be described in each of the cases in which these electrode finger pitches having the same or substantially the same length are changed from being small to medium and then to large.

In this case, when the pitch of the electrode fingers is small in length, the pitch thereof is about 5.08 µm. When the pitch of the electrode fingers is medium in length, the pitch thereof is about 5.02 µm. When the pitch of the electrode fingers is large in length, the pitch thereof is about 5.14 µm. The pitch λ1 of the electrode fingers in the first region 141 is about 4.69 µm, and the pitch λ5 of the electrode fingers in the first region 145 is about 4.77 µm. As an example, the numbers of pairs of electrode fingers in the second region 142, the third region 144, and the fourth region 143 are three, two, and five, respectively. At this time, the numbers of electrode fingers in the first regions 141 and 145 are three and eight, respectively.

In FIG. 6, each output impedance of the surface acoustic wave filter 10 in the cases of the electrode finger pitch being small, medium and large, is indicated by a broken line, a dot-dash line, and a solid line, respectively.

As the pitch of the electrode fingers of the resonator 14 is increased from being small to medium and then to large, the output impedance in the pass band of the surface acoustic wave filter 10 is shifted in a direction from left to right in the Smith chart shown in FIG. 6. That is, it can be seen that, as the pitch of the electrode fingers of the resonator 14 is increased from being small to medium and then to large, the output impedance in the pass band of the surface acoustic wave filter 10 increases. Specifically, it can be seen that the real-number component of the output impedance increases.

In other words, by increasing the pitches λ2, λ4, and λ3 of the electrode fingers in the second region 142, the third region 144, and the fourth region 143, the resistance of "4" is increased.

Working Example 1

Next, output impedance characteristics of the surface acoustic wave filter 10 will be described in the case in which the electrode finger pitches in the second region 142, the third region 144, and the fourth region 143 of the resonator 14 satisfy the relationship λ3<λ2<λ4. Note that the pitches λ1 and λ5 of the electrode fingers in the first regions 141 and 145 are not changed from the values set in the above-described comparative example. In other words, the electrode finger pitches λ1 and λ5 are smaller than the electrode finger pitches λ2, λ4, and λ3 in the second region 142, the third region 144, and the fourth region 143.

Figure 7:
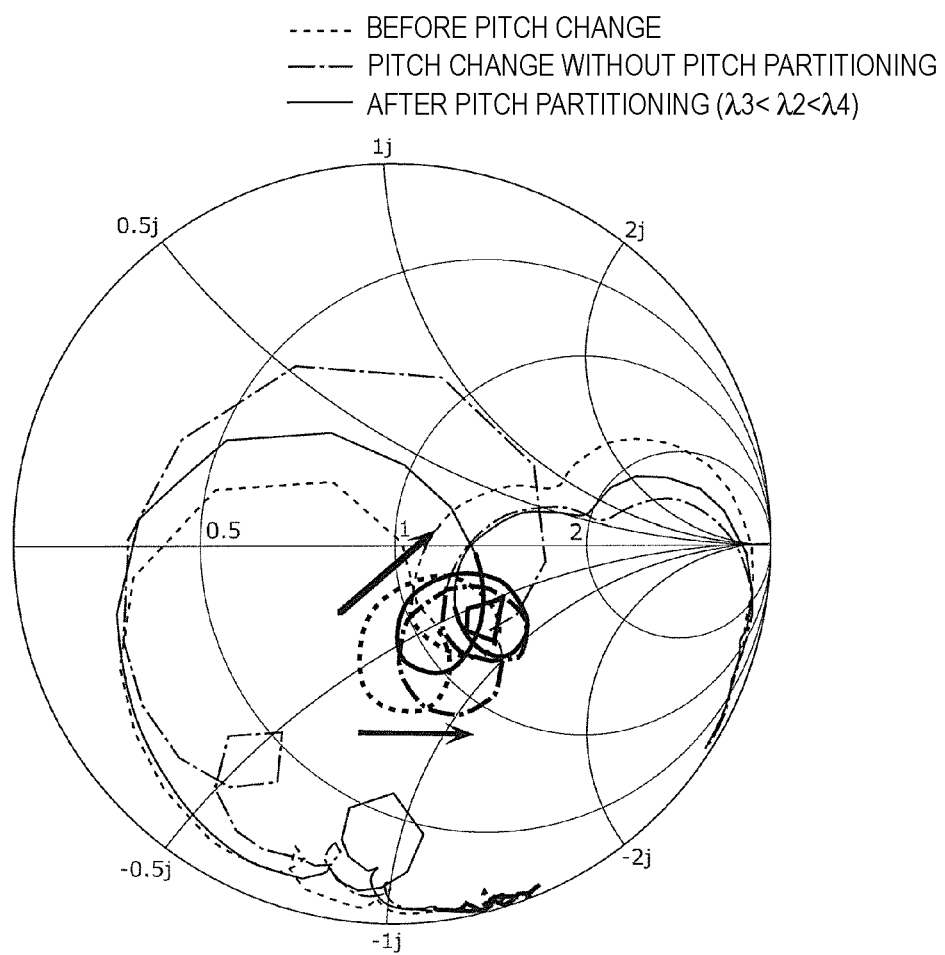
FIG. 7 is a chart showing output impedance characteristics of a surface acoustic wave filter according to a Working Example 1 of the first preferred embodiment of the present invention.

FIG. 7 is a chart showing the output impedance characteristics of the surface acoustic wave filter 10 according to the present Working Example. In FIG. 7, a case in which the electrode finger pitches are not changed is indicated by a broken line, a case in which only the electrode finger pitches are changed is indicated by a dot-dash line, and a case in which the electrode finger pitches are partitioned into a plurality of regions and are changed so that each of the regions has a different pitch is indicated by a solid line.

Here, the case in which the electrode finger pitches are not changed refers to a case in which the electrode finger pitches shown in the comparative example are not changed from the configuration at the time of the electrode finger pitch being small. The case in which only the electrode finger pitches are changed refers to a case in which the electrode finger pitches shown in the comparative example are changed from being small to being medium. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the stated pitches satisfy the relationship $\lambda 3<\lambda 2<\lambda 4$. For example, as the electrode finger pitches satisfying the relationship $\lambda 3<\lambda 2<\lambda 4$, $\lambda 2$ is set to be about 5.00 μm, $\lambda 3$ is set to be about 4.80 μm, and $\lambda 4$ is set to be about 5.19 μm. As an example, the numbers of pairs of electrode fingers in the second region 142, the third region 144, and the fourth region 143 are three, two, and five, respectively. At this time, the numbers of electrode fingers in the first regions 141 and 145 are three and eight, respectively.

As shown in FIG. 7, in the case in which the pitches of electrode fingers are changed to satisfy the relationship $\lambda 3<\lambda 2<\lambda 4$, the output impedance in the pass band of the surface acoustic wave filter 10 is shifted in the rightward direction and the upward direction in the Smith chart shown in FIG. 7, as compared with the case in which the pitches of electrode fingers are not changed. In other words, the output impedance of the surface acoustic wave filter 10 is shifted in the upper right direction in the Smith chart, unlike the case of the comparative example in which only the pitches of electrode fingers are changed.

This indicates that, by changing the pitches of the electrode fingers of the resonator 14 such that the pitches satisfy the relationship $\lambda 3<\lambda 2<\lambda 4$, the output impedance in the pass band of the surface acoustic wave filter 10 is shifted toward capacitive impedance while the resistance is increased.

Accordingly, the output impedance of the surface acoustic wave filter 10 is able to be adjusted so that the resistance and the capacitive impedance are increased by changing the pitches $\lambda 2$, $\lambda 4$, and $\lambda 3$ of the electrode fingers in the second region 142, the third region 144, and the fourth region 143 such that the pitches $\lambda 2$, $\lambda 4$, and $\lambda 3$ satisfy the relationship $\lambda 3<\lambda 2<\lambda 4$.

Working Example 2

Next, output impedance characteristics of the surface acoustic wave filter 10 will be described in the case in which the electrode finger pitches in the second region 142, the third region 144, and the fourth region 143 of the resonator 14 satisfy the relationship $\lambda 2<\lambda 3<\lambda 4$. Also in the present Working Example, similar to the Working Example 1, the electrode finger pitches $\lambda 1$ and $\lambda 5$ are smaller than the electrode finger pitches $\lambda 2$, $\lambda 4$, and $\lambda 3$ in the second region 142, the third region 144, and the fourth region 143.

Figure 8:
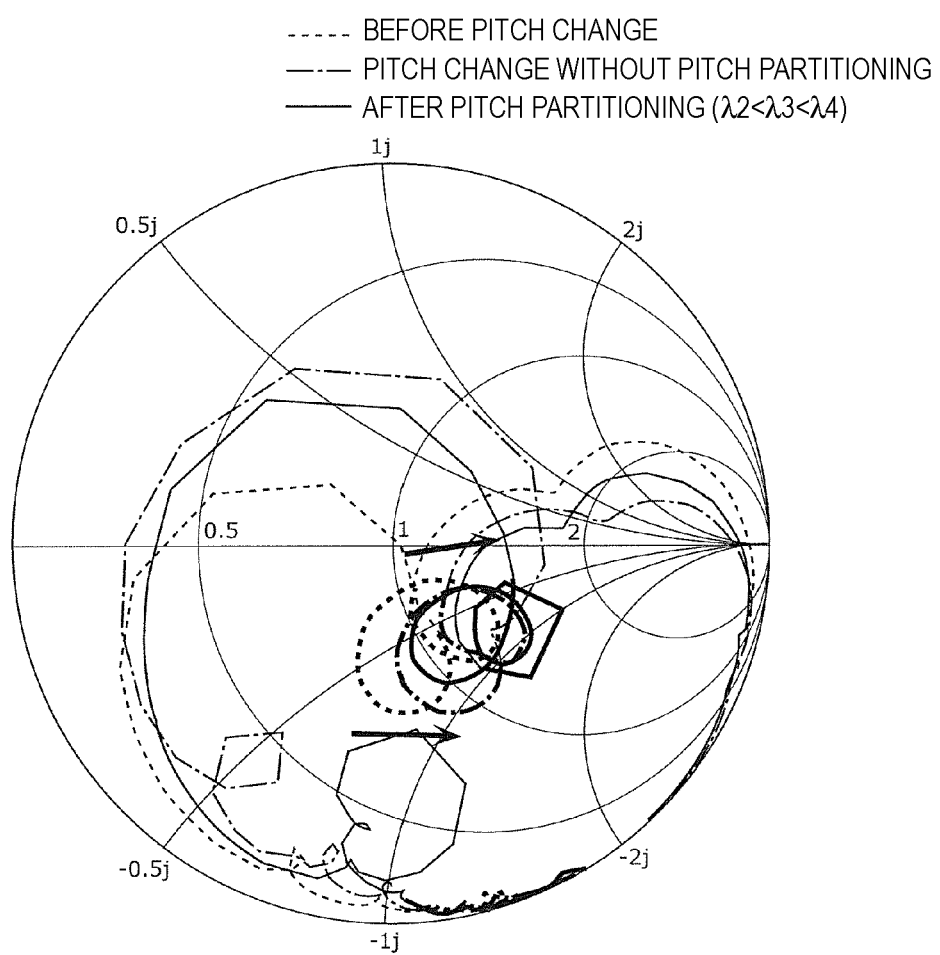
FIG. 8 is a chart showing output impedance characteristics of a surface acoustic wave filter according to a Working Example 2 of the first preferred embodiment of the present invention.

FIG. 8 is a chart showing the output impedance characteristics of the surface acoustic wave filter according to the present Working Example. In FIG. 8, a case in which the electrode finger pitches are not changed is indicated by a broken line, a case in which only the electrode finger pitches are changed is indicated by a dot-dash line, and a case in which the electrode finger pitches are partitioned into a plurality of regions and are changed so that each of the regions has a different pitch is indicated by a solid line.

Here, the case in which the pitches of electrode fingers are not changed and the case in which only the pitches of electrode fingers are changed are the same or substantially the same as those in the Working Example 1. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the pitches satisfy the relationship $\lambda 2<\lambda 3<\lambda 4$. For example, as the electrode finger pitches satisfying the relationship $\lambda 2<\lambda 3<\lambda 4$, $\lambda 2$ is set to be about 4.90 μm, $\lambda 3$ is set to be about 5.00 μm, and $\lambda 4$ is set to be about 5.19 μm. As in the Working Example 1, as an example, the numbers of pairs of electrode fingers in the second region 142, the third region 144, and the fourth region 143 are three, two, and five, respectively. Further, the numbers of electrode fingers in the first regions 141 and 145 are three and eight, respectively.

As shown in FIG. 8, in the case in which the pitches of the electrode fingers are changed as described above, the output impedance in the pass band of the surface acoustic wave filter 10 is shifted in the rightward direction in the Smith chart shown in FIG. 8 as compared with the case in which the pitches of electrode fingers are not changed. In this case, the shift in the upward direction in the Smith chart is smaller in amount than that in the case of the Working Example 1.

This indicates that, by changing the pitches of the electrode fingers of the resonator 14 such that the pitches satisfy the relationship $\lambda 2<\lambda 3<\lambda 4$, the output impedance in the pass band of the surface acoustic wave filter 10 makes the resistance increase. In addition, although the output impedance shifts toward capacitive impedance as well, it is indicated that the amount of shift toward the capacitive impedance is small as compared with the case of the Working Example 1.

Accordingly, the output impedance of the surface acoustic wave filter 10 is able to be adjusted so that the resistance becomes large and the capacitive impedance is slightly increased by changing the pitches $\lambda 2$, $\lambda 4$, and $\lambda 3$ of the electrode fingers in the second region 142, the third region 144, and the fourth region 143 such that the electrode finger pitches $\lambda 2$, $\lambda 4$, and $\lambda 3$ satisfy the relationship $\lambda 2<\lambda 3<\lambda 4$.

Working Example 3

Next, output impedance characteristics of the surface acoustic wave filter 10 will be described in the case in which the electrode finger pitches in the second region 142, the third region 144, and the fourth region 143 of the resonator 14 satisfy the relationship $\lambda 3<\lambda 4<\lambda 2$. Also in the present Working Example, similar to the Working Example 1, the electrode finger pitches $\lambda 1$ and $\lambda 5$ are smaller than the electrode finger pitches $\lambda 2$, $\lambda 4$, and $\lambda 3$ in the second region 142, the third region 144, and the fourth region 143.

Figure 9:
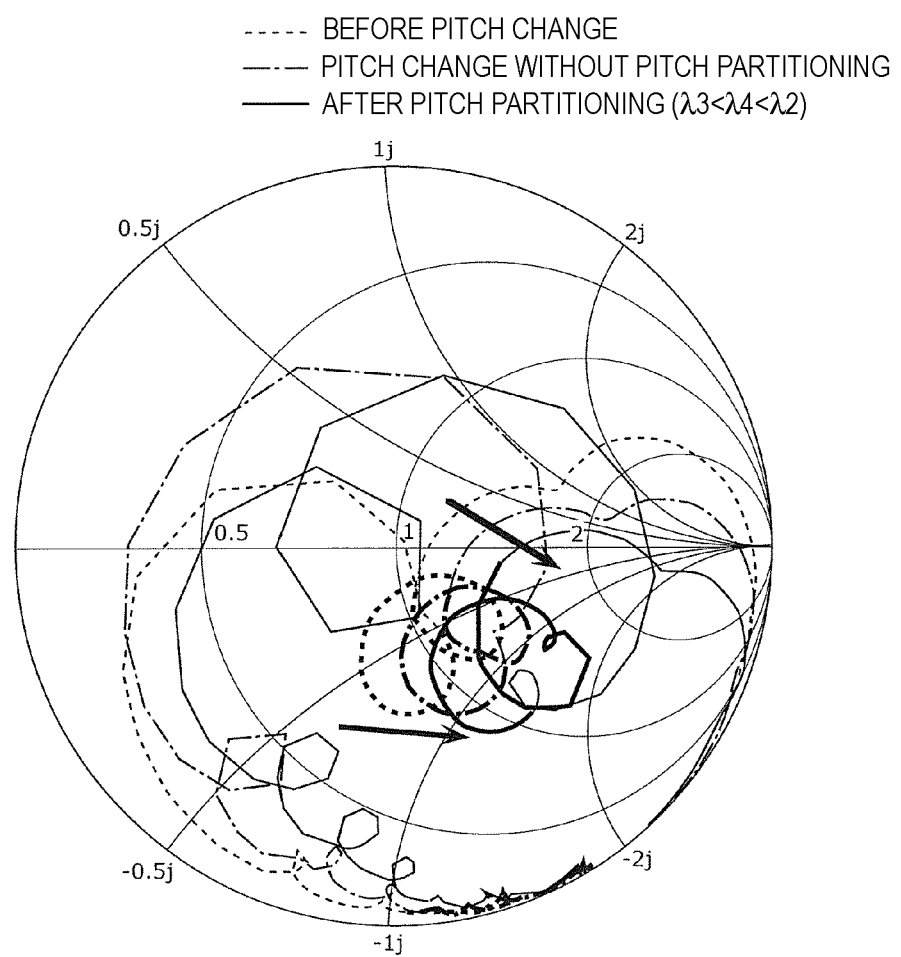
FIG. 9 is a chart showing output impedance characteristics of a surface acoustic wave filter according to a Working Example 3 of the first preferred embodiment of the present invention.

FIG. 9 is a chart showing the output impedance characteristics of the surface acoustic wave filter according to the present Working Example. In FIG. 9, a case in which the electrode finger pitches are not changed is indicated by a broken line, a case in which only the electrode finger pitches are changed is indicated by a dot-dash line, and a case in which the electrode finger pitches are partitioned into a plurality of regions and are changed so that each of the regions has a different pitch is indicated by a solid line.

Here, the case in which the pitches of electrode fingers are not changed and the case in which only the pitches of electrode fingers are changed are the same or substantially the same as those in the Working Example 1. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the pitches satisfy the relationship $\lambda 3<\lambda 4<\lambda 2$. For example, as the electrode finger pitches satisfying the relationship $\lambda 3<\lambda 4<\lambda 2$, $\lambda 2$ is set to be about 5.29 μm, $\lambda 3$ is set to be about 5.09 μm, and $\lambda 4$ is set to be about 5.14 μm. Like in the Working Example 1, as an example, the numbers of pairs of electrode fingers in the second region 142, the third region 144, and the fourth region 143 are three, two, and five, respectively. Further, the numbers of electrode fingers in the first regions 141 and 145 are three and eight, respectively.

As shown in FIG. 9, in the case in which the pitches of electrode fingers are changed as described above, the output impedance of the surface acoustic wave filter 10 is shifted in the rightward direction and the downward direction in the Smith chart shown in FIG. 9 as compared with the case in which the pitches of electrode fingers are not changed. In other words, the output impedance in the pass band of the surface acoustic wave filter 10 is shifted in the lower right direction in the Smith chart, unlike the case of the comparative example in which only the pitches of electrode fingers are changed.

This indicates that, by changing the pitches of the electrode fingers of the resonator 14 such that the pitches satisfy the relationship $\lambda 3<\lambda 4<\lambda 2$, the output impedance in the pass band of the surface acoustic wave filter 10 is shifted toward inductive impedance while the resistance is increased.

Accordingly, the output impedance of the surface acoustic wave filter 10 is able to be adjusted so that the resistance and the inductive impedance are increased by changing the pitches $\lambda 2$, $\lambda 4$, and $\lambda 3$ of the electrode fingers in the second region 142, the third region 144, and the fourth region 143 in such a manner that the pitches $\lambda 2$, $\lambda 4$, and $\lambda 3$ satisfy the relationship $\lambda 3<\lambda 4<\lambda 2$.

Working Example 4

Next, output impedance characteristics of the surface acoustic wave filter 10 will be described in the case in which the electrode finger pitches in the second region 142, the third region 144, and the fourth region 143 of the resonator 14 satisfy the relationship $\lambda 4<\lambda 3<\lambda 2$. Also in the present Working Example, similar to the Working Example 1, the electrode finger pitches $\lambda 1$ and $\lambda 5$ are smaller than the electrode finger pitches $\lambda 2$, $\lambda 4$, and $\lambda 3$ in the second region 142, the third region 144, and the fourth region 143.

Figure 10:
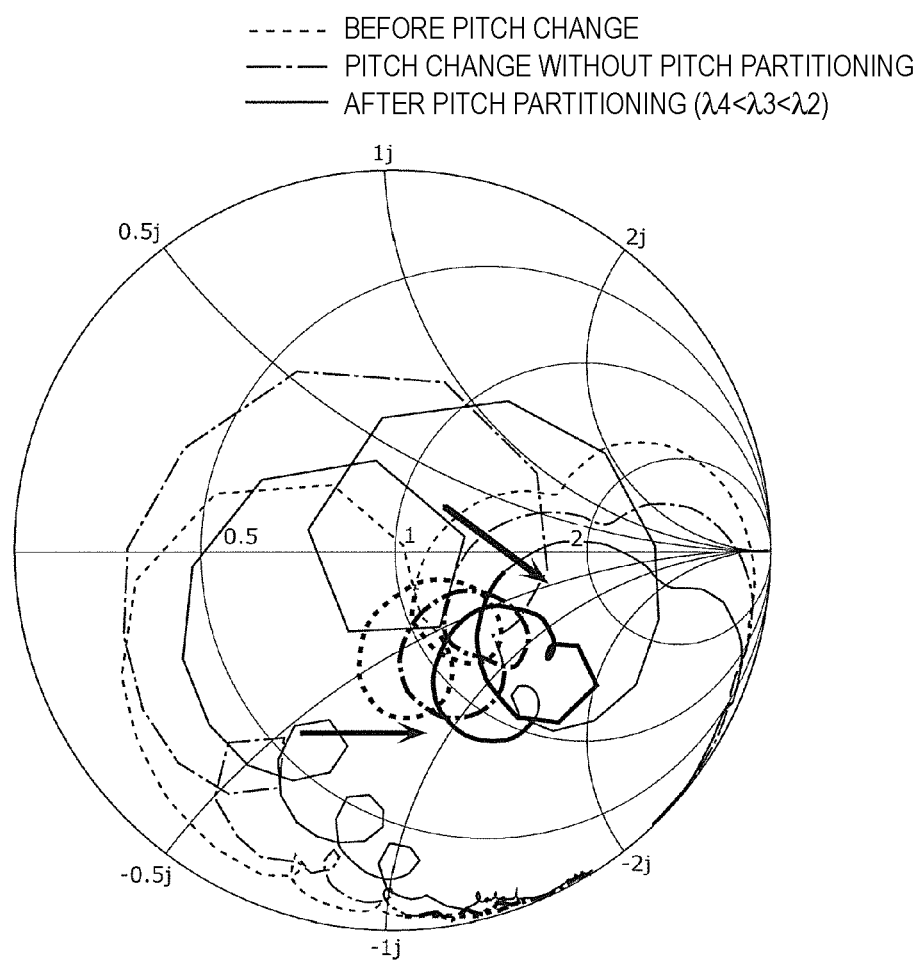
FIG. 10 is a chart showing output impedance characteristics of a surface acoustic wave filter according to a Working Example 4 of the first preferred embodiment. of the present invention.

FIG. 10 is a chart showing the output impedance characteristics of the surface acoustic wave filter according to the present Working Example. In FIG. 10, a case in which the electrode finger pitches are not changed is indicated by a broken line, a case in which only the electrode finger pitches are changed is indicated by a dot-dash line, and a case in which the electrode finger pitches are partitioned into a plurality of regions and are changed so that each of the regions has a different pitch is indicated by a solid line.

Here, the case in which the pitches of electrode fingers are not changed and the case in which only the pitches of electrode fingers are changed are the same or substantially the same as those in the Working Example 1. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the pitches satisfy the relationship $\lambda 4<\lambda 3<\lambda 2$. For example, as the electrode finger pitches satisfying the relationship $\lambda 4<\lambda 3<\lambda 2$, $\lambda 2$ is set to be about 5.29 μm, $\lambda 3$ is set to be about 5.16 μm, and $\lambda 4$ is set to be about 5.14 μm. Like in the Working Example 1, as an example, the numbers of pairs of electrode fingers in the second region 142, the third region 144, and the fourth region 143 are three, two, and five, respectively. Further, the numbers of electrode fingers in the first regions 141 and 145 are three and eight, respectively.

As shown in FIG. 10, in the case in which the pitches of electrode fingers are changed as described above, the output impedance of the surface acoustic wave filter 10 is shifted in the rightward direction and the downward direction in the Smith chart shown in FIG. 10 as compared with the case in which the pitches of electrode fingers are not changed. In other words, the output impedance in the pass band of the surface acoustic wave filter 10 is shifted in the lower right direction in the Smith chart, unlike the case of the comparative example in which only the pitches of electrode fingers are changed. In this case, the shift in the downward direction in the Smith chart is larger in amount than that in the case of the Working Example 3.

This indicates that, by changing the pitches of the electrode fingers of the resonator 14 such that the pitches satisfy the relationship $\lambda 4<\lambda 3<\lambda 2$, the output impedance in the pass band of the surface acoustic wave filter 10 is shifted toward inductive impedance more than in the case of the Working Example 3, in addition to achieving the increase in resistance.

Accordingly, the output impedance of the surface acoustic wave filter 10 is able to be adjusted so that the resistance becomes large and the capacitive impedance is increased by a greater amount by changing the pitches $\lambda 2$, $\lambda 4$, and $\lambda 3$ of the electrode fingers in the second region 142, the third region 144, and the fourth region 143 such that the electrode finger pitches $\lambda 2$, $\lambda 4$, and $\lambda 3$ satisfy the relationship $\lambda 4<\lambda 3<\lambda 2$.

Next, transmission characteristics of the surface acoustic wave filter 10 will be described. Hereinafter, a case in which the electrode finger pitches of the resonator 14 are not changed, a case in which an intersecting width of the resonator 14 is changed, and a case in which the electrode finger pitches are partitioned into a plurality of regions and are changed so that each of the regions has a different pitch will be described.

Figure 11A:
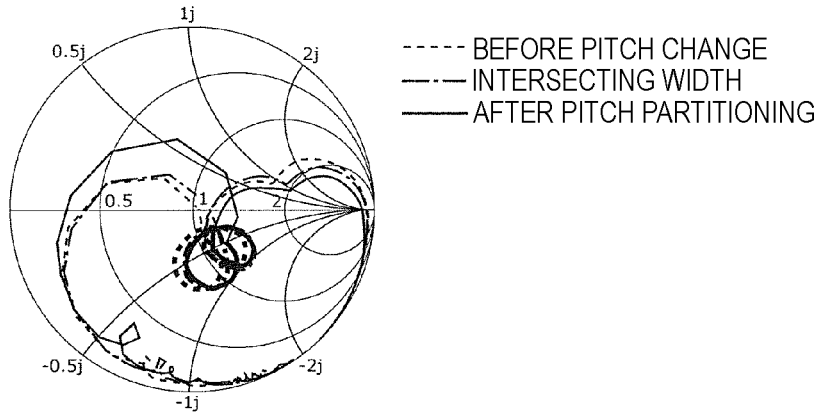
FIG. 11A is a chart showing output impedance characteristics of the surface acoustic wave filter according to the first preferred embodiment of the present invention.

FIG. 11A is a chart showing output impedance characteristics of the surface acoustic wave filter according to the present preferred embodiment. In FIG. 11A, a case in which the electrode finger pitches are not changed is indicated by a broken line, a case in which the intersecting width of electrode fingers is changed is indicated by a dot-dash line, and a case in which the electrode finger pitches are partitioned into a plurality of regions and are changed so that each of the regions has a different pitch is indicated by a solid line.

Here, the case in which the electrode finger pitches are not changed refers to a case in which the electrode finger pitches shown in the comparative example are not changed from the configuration at the time of the electrode finger pitch being small. The case in which the intersecting width of electrode fingers is changed refers to a case in which only the intersecting width is changed from the configuration at the time of the electrode finger pitch being small as shown in the comparative example. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the pitches satisfy the relationship $\lambda 3<\lambda 4<\lambda 2$. For example, as the electrode finger pitches satisfying the relationship $\lambda 3<\lambda 4<\lambda 2$, $\lambda 2$ is set to be about 5.07 μm, $\lambda 3$ is set to be about 5.02 μm, and $\lambda 4$ is set to be about 5.06 μm.

As shown in FIG. 11A, in the case in which the intersecting width of the electrode fingers is changed, the output impedance in the pass band of the surface acoustic wave filter 10 is shifted in the rightward direction in the Smith chart as compared with the case of the electrode finger pitch shown in the comparative example being small. Further, in the case in which the pitches of electrode fingers are partitioned into the plurality of regions and are changed so that each of the regions has a different pitch, the output impedance of the surface acoustic wave filter 10 is further shifted in the rightward direction in the Smith chart shown in FIG. 11A as compared with the case in which the pitches of electrode fingers are not changed.

That is, also in the case in which the intersecting width of electrode fingers is changed and also in the case in which the pitches of electrode fingers are partitioned into the plurality of regions and are changed so that each of the regions has a different pitch, the output impedance in the pass band of the surface acoustic wave filter 10 increases. In the case in which the pitches of electrode fingers are partitioned into the plurality of regions and are changed so that each of the regions has a different pitch, the output impedance of the surface acoustic wave filter 10 is able to be changed more than in the case in which the intersecting width of electrode fingers is changed.

Figure 11B:
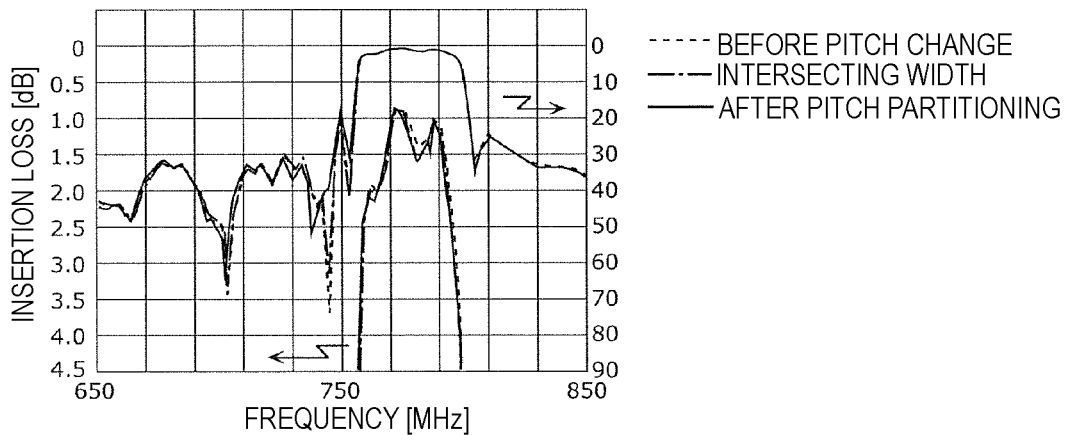
FIG. 11B is a graph showing bandpass characteristics of the surface acoustic wave filter according to the first preferred embodiment of the present invention.
Figure 11C:
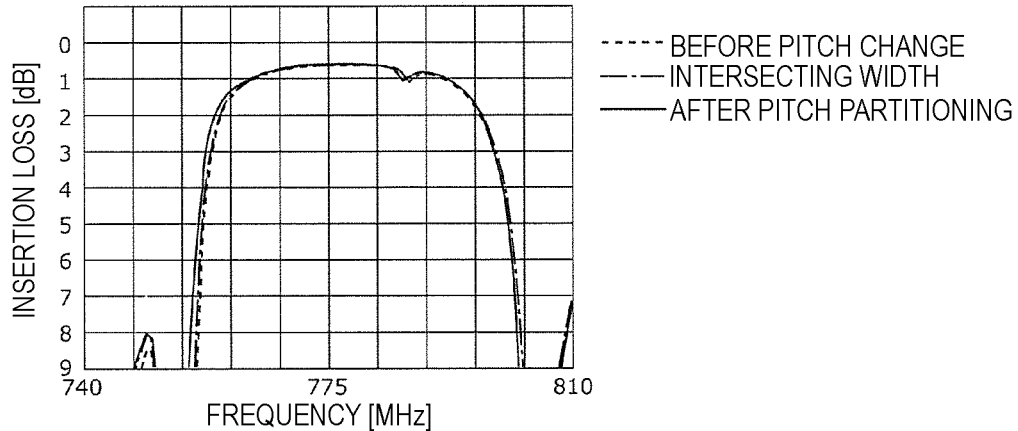
FIG. 11C is a graph showing bandpass characteristics of the surface acoustic wave filter according to the first preferred embodiment of the present invention.
Figure 11D:
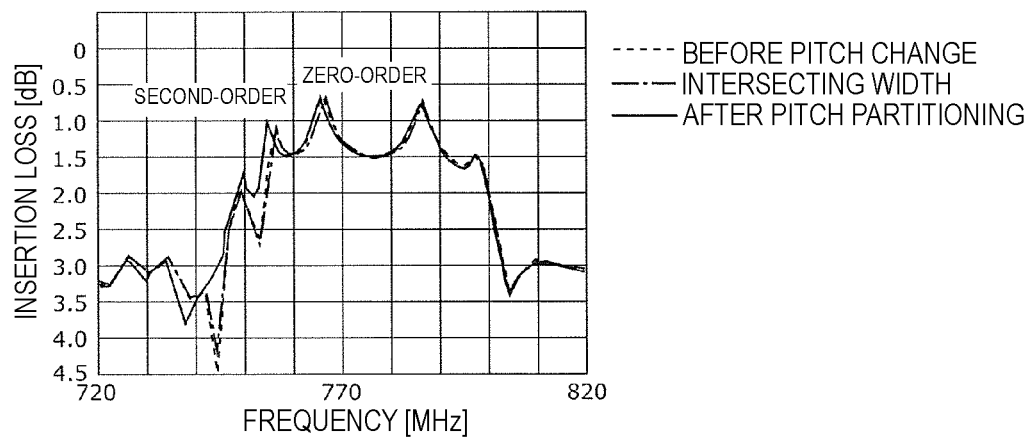
FIG. 11D is a graph showing bandpass characteristics of the surface acoustic wave filter according to the first preferred embodiment of the present invention.

FIGS. 11B to 11D are graphs showing bandpass characteristics of the surface acoustic wave filter 10 according to the first preferred embodiment. Note that FIG. 11C shows the bandpass characteristics of the surface acoustic wave filter 10 when mismatching loss is eliminated, in order to make a change in band width more easily recognizable. In FIGS. 11B to 11D, a case in which the pitches of electrode fingers are not changed is indicated by a broken line, a case in which the intersecting width of electrode fingers is changed is indicated by a dot-dash line, and a case in which the electrode finger pitches are partitioned into a plurality of regions and are changed so that each of the regions has a different pitch is indicated by a solid line.

As shown in FIGS. 11B and 11C, in the case in which the pitches of electrode fingers are partitioned into the plurality of regions and are changed so that each of the regions has a different pitch, the pass band width of the surface acoustic wave filter 10 is broadened as compared with the case in which the pitches of electrode fingers are not changed and the case in which the intersecting width of electrode fingers is changed. In particular, as can be easily seen from FIG. 11C, the pass band on a lower frequency side is broadened. Therefore, it is more effective in broadening the band to partition the pitches of electrode fingers into a plurality of regions so that each of the regions has a different pitch than to change the intersecting width of electrode fingers.

This is because, as shown in FIG. 11D, the resonant frequency of the zero-order resonant mode and the resonant frequency of the second-order resonant mode of the surface acoustic wave filter 10 are shifted toward the lower frequency side. As shown in FIG. 11D, the resonant frequency of the zero-order resonant mode of the bandpass characteristics of the surface acoustic wave filter 10 is shifted toward the lower frequency side in the case in which the pitches of electrode fingers are partitioned into the plurality of regions and are changed so that each of the regions has a different pitch, in comparison with the bandpass characteristics of the surface acoustic wave filter in the case where the pitches of electrode fingers are not changed and the case in which the intersecting width of electrode fingers is changed. Accordingly, in the case in which the pitches of electrode fingers are partitioned into a plurality of regions and are changed so that each of the regions has a different pitch, the pass band width of the surface acoustic wave filter 10 is broadened in comparison with the bandpass characteristics of the surface acoustic wave filter in the case in which the pitches of electrode fingers are not changed and the case in which the intersecting width of electrode fingers is changed.

Further, both the resonant frequency of the zero-order resonant mode and the resonant frequency of the second-order resonant mode are shifted toward the lower frequency side. At this time, the resonant frequency of the second-order resonant mode is shifted to a greater extent toward the lower frequency side than the resonant frequency of the zero-order resonant mode. As such, since the interval between the resonant frequency of the zero-order resonant mode and the resonant frequency of the second-order resonant mode is broadened, coupling between these resonant modes is weakened.

Since the coupling between the zero-order resonant mode and the second-order resonant mode is weakened, in the surface acoustic wave filter 10 of the case in which the pitches of electrode fingers are partitioned into the plurality of regions and are changed so that each of the regions has a different pitch, output impedance in the pass band is deviated from the center of the Smith chart in comparison with output impedance of the surface acoustic wave filter of the case in which the pitches of electrode fingers are not changed and the case in which the intersecting width of electrode fingers is changed, as shown in FIG. 11A. In other words, the output impedance of the surface acoustic wave filter 10 changes in a direction in which the resistance increases.

As described above, by partitioning the pitches of electrode fingers into a plurality of regions and changing the pitches so that each of the regions has a different pitch, it is possible to change the output impedance while broadening the pass band width of the surface acoustic wave filter 10. In other words, it is possible to adjust the output impedance of the surface acoustic wave filter 10 without deteriorating the bandpass characteristics of the surface acoustic wave filter 10. In addition, it is possible to adjust the output impedance while maintaining the bandpass characteristics in a favorable state in the case in which the pitches of electrode fingers are partitioned into a plurality of regions and are changed so that each of the regions has a different pitch, in comparison with the case in which the intersecting width of the electrode fingers of the surface acoustic wave filter 10 is changed.

As described thus far, with the surface acoustic wave filter 10 according to the present preferred embodiment, it is possible to adjust the output impedance of the surface acoustic wave filter 10 without deteriorating the bandpass characteristics of the surface acoustic wave filter 10.

At this time, by making the pitches $\lambda 2$ and $\lambda 4$ of the electrode fingers in the second region 142 and the third region 144 of the resonator 14 satisfy the relationship $\lambda 2 < \lambda 4$, the output impedance of the surface acoustic wave filter 10 is able to be shifted toward inductive impedance as well as resistance. Further, by making the pitches $\lambda 2$ and $\lambda 4$ of the electrode fingers satisfy the relationship $\lambda 4 < \lambda 2$, the output impedance of the surface acoustic wave filter 10 is able to be shifted toward capacitive impedance as well as the resistance.

Furthermore, by making the pitch $\lambda 3$ of the electrode fingers in the fourth region 143 of the resonator 14 smaller than the pitches $\lambda 2$ and $\lambda 4$ of the electrode fingers in the second region 142 and the third region 144, the output impedance of the surface acoustic wave filter 10 is able to be shifted toward inductive impedance.

As described above, with the surface acoustic wave filter 10 according to the present preferred embodiment, it is possible to shift the output impedance in two or more directions. In other words, the output impedance of the surface acoustic wave filter 10 is able to be adjusted including resistance, capacitive impedance, and inductive impedance.

Although, in the present preferred embodiment, the resonator 14 is partitioned into five regions with different electrode finger pitches, the present invention is not limited to five regions, and the number of regions may be four, or may be equal to or more than six. By making each of the five regions have a different value of the electrode finger pitch, the output impedance of the surface acoustic wave filter 10 is able to be adjusted more finely than in the case in which the number of regions is four.

Although, in the present preferred embodiment, the surface acoustic wave filter 10 includes three resonators, the number of resonators is not limited thereto, and may be changed. For example, the surface acoustic wave filter may include five resonators.

Further, the pitches of electrode fingers and the number of pairs of electrode fingers are not limited to those described above, and may be changed as appropriate. Furthermore, the pitch of the electrode fingers in the fourth region may be smaller than the pitch of the electrode fingers in either one of the second region and the third region, or may be smaller than the pitches of the electrode fingers in both of the second and third regions.

Second Preferred Embodiment

A second preferred embodiment of the present invention will be described. A high frequency module 1 according to the present preferred embodiment differs from the high frequency module 1 according to the first preferred embodiment in that the number of pairs of electrode fingers in each of the regions other than the first regions is the same.

Hereinafter, the surface acoustic wave filter 10 according to the present preferred embodiment will be described in comparison with the surface acoustic wave filter 10 in the Working Example 1 of the above-described first preferred embodiment. In the Working Example 1, the surface acoustic wave filter 10 in which the electrode finger pitches in the second region 142, the third region 144, and the fourth region 143 of the resonator 14 satisfy the relationship $\lambda 3 < \lambda 2 < \lambda 4$ is described. In the surface acoustic wave filter 10 of the Working Example 1, the pitches of electrode fingers are set as follows: $\lambda 2$=about 5.00 μm, $\lambda 3$=about 4.79 μm, and $\lambda 4$=about 5.19 μm. In addition, as an example, the numbers of pairs of electrode fingers in the second region 142, the third region 144, and the fourth region 143 are three, two, and five, respectively. At this time, the numbers of electrode fingers in the first regions 141 and 145 are three and eight, respectively.

Hereinafter, description will be provided of output impedance in the cases in which the pitches $\lambda 2$, $\lambda 4$, and $\lambda 3$ of the electrode fingers in the second region 142, the third region 144, and the fourth region 143 of the resonator 14 satisfy a relationship $\lambda 3 < \lambda 2 < \lambda 4$ (Working Example 5) and a relationship $\lambda 2 < \lambda 3 < \lambda 4$ (Working Example 6), while the numbers of pairs of electrode fingers in the second region 142, the third region 144, and the fourth region 143 are the same.

Working Example 5

First, output impedance characteristics of the surface acoustic wave filter 10 will be described in the case in which the pitches of the electrode fingers of the resonator 14 satisfy the relationship $\lambda 3 < \lambda 2 < \lambda 4$ and the numbers of pairs of electrode fingers in the second region 142, the third region 144, and the fourth region 143 are the same.

Figure 12:
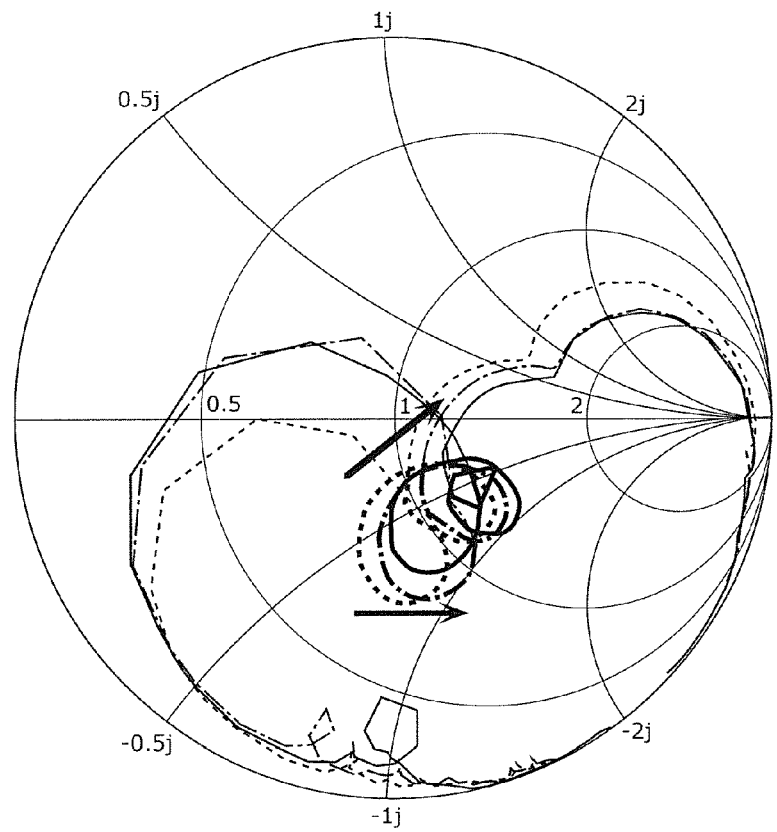
FIG. 12 is a chart showing output impedance characteristics of a surface acoustic wave filter according to a Working Example 5 of a second preferred embodiment of the present invention.

FIG. 12 is a chart showing the output impedance characteristics of the surface acoustic wave filter 10 according to the present Working Example. In FIG. 12, a case in which the electrode finger pitches are not changed is indicated by a broken line, a case in which only the electrode finger pitches are changed is indicated by a dot-dash line, and a case in which the electrode finger pitches are partitioned into a plurality of regions and are changed so that each of the regions has a different pitch is indicated by a solid line.

Here, similarly to the Working Example 1, the case in which the electrode finger pitches are not changed refers to a case in which the electrode finger pitches shown in the comparative example are not changed from the configuration at the time of the electrode finger pitch being small. The case in which only the electrode finger pitches are changed refers to a case in which the electrode finger pitches shown in the comparative example are changed from being small to being medium. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the pitches satisfy the relationship $\lambda 3 < \lambda 2 < \lambda 4$. For example, as the electrode finger pitches satisfying the relationship $\lambda 3 < \lambda 2 < \lambda 4$, $\lambda 2$ is set to be about 5.00 μm, $\lambda 3$ is set to be about 4.79 μm, and $\lambda 4$ is set to be about 5.19 μm. Further, the numbers of electrode fingers in the second region 142, the third region 144, and the fourth region 143 are the same, and as an example, the number of electrode fingers in each region is six. At this time, the numbers of electrode fingers in the first regions 141 and 145 are three and eight, respectively.

As shown in FIG. 12, in the case in which the numbers of electrode fingers in the second region 142, the third region 144, and the fourth region 143 are set to be the same and the pitches of the electrode fingers are changed so as to satisfy the relationship $\lambda 3 < \lambda 2 < \lambda 4$, the output impedance in the pass band of the surface acoustic wave filter 10 is shifted in the upper right direction in the Smith chart shown in FIG. 12, as compared with the case in which the pitches of the electrode fingers are not changed.

This indicates that, by changing the pitches of the electrode fingers of the resonator 14 such that the pitches satisfy the relationship $\lambda 3 < \lambda 2 < \lambda 4$, the output impedance in the pass band of the surface acoustic wave filter 10 is shifted toward capacitive impedance while the resistance is increased.

Further, in comparison with the surface acoustic wave filter 10 of the Working Example 1 shown in FIG. 7, although the output impedance in the pass band of the surface acoustic wave filter 10 according to the present Working Example exhibits a small change as a whole, the output impedance slightly changes toward inductive impedance as compared with the output impedance in the pass band of the surface acoustic wave filter 10 in the Working Example 1. The reason for this is as follows: since the number of pairs of electrode fingers in the fourth region 143 is increased from two to three, and the number of pairs of electrode fingers in the third region 144 is decreased from five to three, the output impedance in the pass band exhibits a rotational change in the leftward direction in the Smith chart. In FIG. 12, since the winding of the output impedance in the Smith chart is broadened, it may also be said that the output impedance in the pass band is likely to vary.

As described above, by causing the numbers of pairs of electrode fingers in the second region 142, the third region 144, and the fourth region 143 to be the same, it is possible to finely adjust the output impedance in the pass band of the surface acoustic wave filter 10. Thus, it is possible to adjust the output impedance of the surface acoustic wave filter 10 without deteriorating the bandpass characteristics of the surface acoustic wave filter 10.

Working Example 6

Next, output impedance characteristics of the surface acoustic wave filter 10 will be described in the case in which the pitches of the electrode fingers of the resonator 14 satisfy the relationship $\lambda 2 < \lambda 3 < \lambda 4$ and the numbers of pairs of electrode fingers in the second region 142, the third region 144, and the fourth region 143 are the same.

Figure 13:
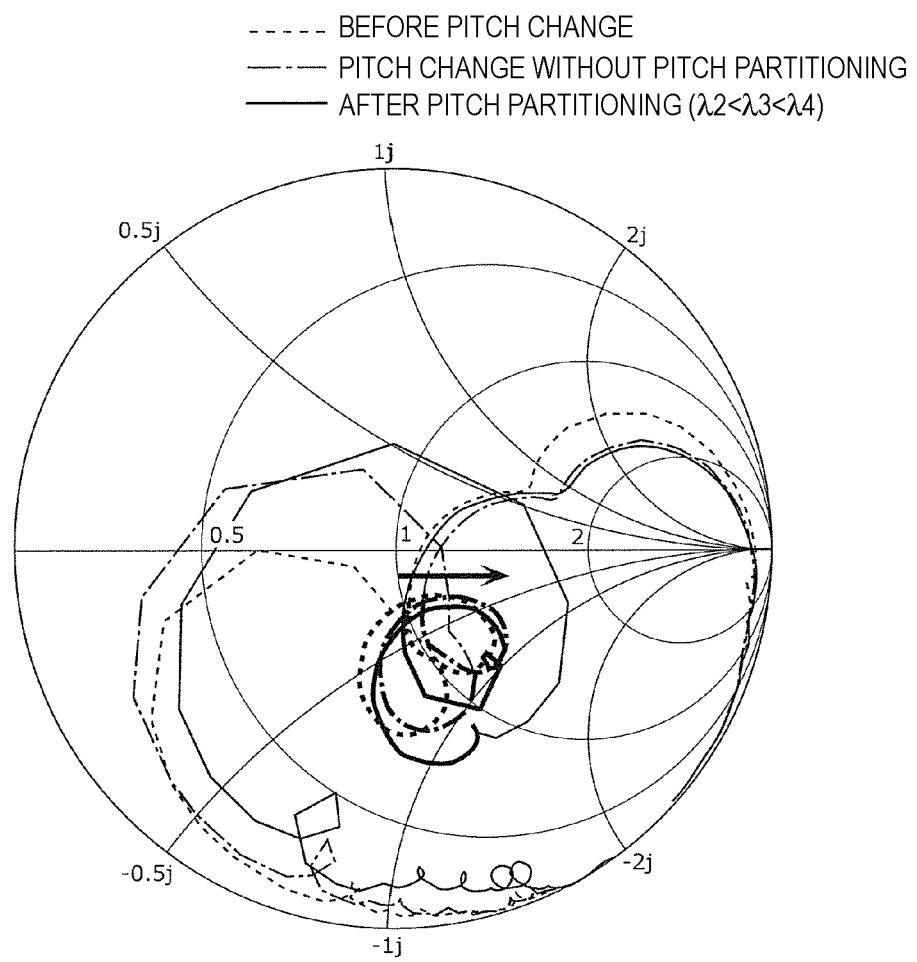
FIG. 13 is a chart showing output impedance characteristics of a surface acoustic wave filter according to a Working Example 6 of the second preferred embodiment of the present invention.

FIG. 13 is a chart showing the output impedance characteristics of the surface acoustic wave filter 10 according to the present Working Example. In FIG. 13, a case in which the electrode finger pitches are not changed is indicated by a broken line, a case in which only the electrode finger pitches are changed is indicated by a dot-dash line, and a case in which the electrode finger pitches are partitioned into a plurality of regions and are changed so that each of the regions has a different pitch is indicated by a solid line.

Here, similarly to the Working Example 1, the case in which the electrode finger pitches are not changed refers to a case in which the electrode finger pitches shown in the comparative example are not changed from the configuration at the time of the electrode finger pitch being small. The case in which only the electrode finger pitches are changed refers to a case in which the electrode finger pitches shown in the comparative example are changed from being small to being medium. The case in which the electrode finger pitches are partitioned into the plurality of regions and are changed so that each of the regions has a different pitch, refers to a case in which the pitches $\lambda 2$, $\lambda 4$, and $\lambda 3$ of the electrode fingers in the second region 142, the third region 144, and the fourth region 143 are changed so that the pitches satisfy the relationship $\lambda 2 < \lambda 3 < \lambda 4$. For example, as the electrode finger pitches satisfying the relationship $\lambda 2 < \lambda 3 < \lambda 4$, $\lambda 2$ is set to be about 4.89 µm, $\lambda 3$ is set to be about 5.00 µm, and $\lambda 4$ is set to be about 5.19 µm. Further, similarly to the Working Example 5, the numbers of electrode fingers in the second region 142, the third region 144, and the fourth region 143 are the same, and as an example, the number of electrode fingers in each region is six. At this time, the numbers of electrode fingers in the first regions 141 and 145 are three and eight, respectively.

As shown in FIG. 13, in the case in which the numbers of electrode fingers in the second region 142, the third region 144, and the fourth region 143 are set to be the same and the pitches of the electrode fingers are changed so as to satisfy the relationship $\lambda 2 < \lambda 3 < \lambda 4$, the output impedance in the pass band of the surface acoustic wave filter 10 is shifted in the rightward direction in the Smith chart shown in FIG. 13, as compared with the case in which the pitches of the electrode fingers are not changed. This indicates that, by changing the pitches of the electrode fingers of the resonator 14 such that the pitches satisfy the relationship $\lambda 2 < \lambda 3 < \lambda 4$, the output impedance in the pass band of the surface acoustic wave filter 10 makes the resistance increase.

Further, in comparison with the surface acoustic wave filter 10 of the Working Example 2 shown in FIG. 8, although the output impedance of the surface acoustic wave filter 10 according to the present Working Example exhibits a small change as a whole as in the case of the Working Example 5, the output impedance is largely shifted toward capacitive impedance as compared with the output impedance in the pass band of the surface acoustic wave filter 10 in the Working Example 2. The reason for this is as follows: since the number of pairs of electrode fingers in the fourth region 143 is increased from two to three, and the number of pairs of electrode fingers in the third region 144 is decreased from five to three, the output impedance in the pass band exhibits a rotational change in the leftward direction in the Smith chart. That is, by causing the numbers of pairs of electrode fingers to be the same, a change toward inductive impedance indicated by the pitch of the electrode fingers in the third region 144 becomes small. In FIG. 13, since the winding of the output impedance in the pass band is broadened in the Smith chart, it may also be said that the output impedance is likely to vary.

As discussed above, by causing the numbers of pairs of electrode fingers in the second region 142, the third region 144, and the fourth region 143 to be the same, it is possible to adjust the output impedance of the surface acoustic wave filter 10 toward capacitive impedance and inductive impedance in a balanced manner. Therefore, in the Smith chart, the output impedance of the surface acoustic wave filter is able to be shifted in two or more directions.

Accordingly, not only by changing the electrode finger pitches in the second region 142, the third region 144 and the fourth region 143, but also by changing the numbers of pairs of electrode fingers in the second region 142, the third region 144 and the fourth region 143, it is possible to adjust the output impedance of the surface acoustic wave filter 10.

The present invention is not limited to the configurations described in the preferred embodiments described above, and may be appropriately modified as described below, for example.

For example, the surface acoustic wave filter according to the preferred embodiments described above may be used in a high frequency module. In this case, as illustrated in FIG. 1, the surface acoustic wave filter 10 may be connected to the low noise amplifier 20 to amplify a high frequency signal that has passed through the surface acoustic wave filter 10.

Further, the surface acoustic wave filter according to the preferred embodiments described above may be used in a multiplexer. In this case, the multiplexer includes a plurality of surface acoustic wave filters, and each of the plurality of surface acoustic wave filters is connected to a common terminal.

Although, in the above-described preferred embodiments, a resonator is partitioned into five regions with different electrode finger pitches, the present invention is not limited to five regions, and the number of regions may be four, or may be equal to or more than six.

Although, in the preferred embodiments described above, the surface acoustic wave filter 10 includes three resonators, the number of resonators is not limited thereto, and may be changed. For example, the surface acoustic wave filter may include five resonators.

Further, the pitches of electrode fingers and the number of pairs of electrode fingers are not limited to those described above, and may be changed as appropriate. Furthermore, the pitch of the electrode fingers in the fourth region may be smaller than the pitch of the electrode fingers in either one of the second region and the third region, or may be smaller than the pitch of the electrode fingers in both of the first and second regions.

In the above-described preferred embodiments, of the three resonators used in the surface acoustic wave filter, the resonator disposed at the center portion includes four or more regions with different electrode finger pitches. However, the present invention is not limited thereto. The resonator may include four regions, or may include a larger number of regions as long as the resonator includes three or more regions.

Further, the resonator including three or more regions with different electrode finger pitches is not limited to any specific one. That is, of the three resonators used in the surface acoustic wave filter, two resonators disposed at both ends may be configured in the manner described above. In this case, the electrode finger pitches in the regions corresponding to each of the two resonators, may be equal to or may be different from each other. In addition, the numbers of pairs of electrode fingers in the regions corresponding to each of the two resonators, may be the same or may be different from each other.

Materials of the substrate, the electrodes, the protective layer, and other components and elements of the resonator are not limited to those described above, and may be changed as appropriate. Further, the pitch of electrode fingers and the number of pairs of electrode fingers of each resonator may be changed as long as they satisfy the above-described conditions.

Note that, preferred embodiments obtained by applying various variations conceived by those skilled in the art on the above-described preferred embodiments and variation examples, or preferred embodiments achieved by arbitrarily combining the elements and functions of the above-described preferred embodiments and variation examples without departing from the spirit and scope of the present invention are also included in the present invention.

Preferred embodiments of the present invention may be used in high frequency modules, duplexers, multiplexers, receiving devices, and other suitable devices that include a surface acoustic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled surface acoustic wave filter comprising:
   a plurality of resonators continuously disposed in a propagation direction of a surface acoustic wave, each of the plurality of resonators including a pair of comb-shaped electrodes each including a busbar electrode, and a plurality of electrode fingers connected to the busbar electrode and disposed parallel or substantially parallel to each other; wherein
   the pair of comb-shaped electrodes are disposed such that the plurality of electrode fingers in each of the pair of comb-shaped electrodes are alternately provided in the propagation direction of the surface acoustic wave;
   of the plurality of resonators, a first resonator connected to an output terminal of the surface acoustic wave filter includes four or more regions with different pitches of the electrode fingers, and in each of the four or more regions, the pitch of the electrode fingers is constant;
   of the four or more regions, a pair of first regions disposed at two ends of the first resonator in the propagation direction of the surface acoustic wave have a smaller pitch of the electrode fingers than the pitch of the electrode fingers in the regions other than the pair of first regions; and
   the pitch of the electrode fingers in a second region adjacent to one of the pair of first regions is different from the pitch of the electrode fingers in a third region adjacent to another one of the pair of first regions.

2. The surface acoustic wave filter according to claim 1, wherein the pitch of the electrode fingers in the third region is larger than the pitch of the electrode fingers in the second region.

3. The surface acoustic wave filter according to claim 1, wherein the pitch of the electrode fingers in the second region is larger than the pitch of the electrode fingers in the third region.

4. The surface acoustic wave filter according to claim 1, wherein the four or more regions include five regions.

5. The surface acoustic wave filter according to claim 4, wherein the pitch of the electrode fingers in a fourth region disposed at a center of the five regions is smaller than at least one of the pitch of the electrode fingers in the second region and the pitch of the electrode fingers in the third region.

6. The surface acoustic wave filter according to claim 1, wherein a number of pairs of the electrode fingers in each of the regions other than the pair of first regions is the same.

7. A high frequency module comprising:
   the surface acoustic wave filter according to claim 1; and
   a low noise amplifier connected to the surface acoustic wave filter and structured to amplify a high frequency signal having passed through the surface acoustic wave filter.

8. The high frequency module according to claim 7, wherein the pitch of the electrode fingers in the third region is larger than the pitch of the electrode fingers in the second region.

9. The high frequency module according to claim 7, wherein the pitch of the electrode fingers in the second region is larger than the pitch of the electrode fingers in the third region.

10. The high frequency module according to claim 7, wherein the four or more regions include five regions.

11. The high frequency module according to claim 10, wherein the pitch of the electrode fingers in a fourth region disposed at a center of the five regions is smaller than at least one of the pitch of the electrode fingers in the second region and the pitch of the electrode fingers in the third region.

12. The high frequency module according to claim 7, wherein a number of pairs of the electrode fingers in each of the regions other than the pair of first regions is the same.

13. A multiplexer comprising:
   a plurality of the surface acoustic wave filters according to claim 1; wherein
   each of the plurality of surface acoustic wave filters is connected to a common terminal.

14. The multiplexer according to claim 13, wherein, in each of the plurality of surface acoustic wave filters, the pitch of the electrode fingers in the third region is larger than the pitch of the electrode fingers in the second region.

15. The multiplexer according to claim 13, wherein, in each of the plurality of surface acoustic wave filters, the pitch of the electrode fingers in the second region is larger than the pitch of the electrode fingers in the third region.

16. The multiplexer according to claim 13, wherein, in each of the plurality of surface acoustic wave filters, the four or more regions include five regions.

17. The multiplexer according to claim 16, wherein, in each of the plurality of surface acoustic wave filters, the pitch of the electrode fingers in a fourth region disposed at a center of the five regions is smaller than at least one of the pitch of the electrode fingers in the second region and the pitch of the electrode fingers in the third region.

18. The multiplexer according to claim 13, wherein, in each of the plurality of the surface acoustic wave filters, a number of pairs of the electrode fingers in each of the regions other than the pair of first regions is the same.

\* \* \* \* \*